United States Patent [19]

Tanemura et al.

[11] Patent Number: 5,043,681
[45] Date of Patent: Aug. 27, 1991

[54] VOLTAGE CONTROLLED OSCILLATOR INCLUDING A SAW RESONATOR

[75] Inventors: Takeshi Tanemura; Takehiko Sone, both of Furukawa, Japan

[73] Assignee: Alps Electric Co., Ltd., Tokyo, Japan

[21] Appl. No.: 525,933

[22] Filed: May 18, 1990

[30] Foreign Application Priority Data

Aug. 8, 1989 [JP] Japan .................... 1-205490

[51] Int. Cl.$^5$ .............................................. H03B 5/32
[52] U.S. Cl. ............................ 331/107 A; 331/177 V
[58] Field of Search .......... 331/107 A, 116 R, 117 R, 331/177 V

[56] References Cited

U.S. PATENT DOCUMENTS

| 4,011,526 | 3/1977 | Kinsman | 331/107 A |
| 4,193,045 | 3/1980 | Houkawa et al. | 331/107 A |
| 4,581,592 | 4/1986 | Bennett | 331/107 A |
| 4,924,195 | 5/1990 | Gonda | 331/116 R |

FOREIGN PATENT DOCUMENTS 63-117107 7/1988 Japan .

Primary Examiner—Siegfried H. Grimm
Attorney, Agent, or Firm—Guy W. Shoup; B. Noël Kivlin

[57] ABSTRACT

A voltage controlled oscillator includes a resonant circuit formed of an impedance in series with a voltage variable capacitance. The impedance consists of a surface acoustic wave resonator in parallel with either an inductance coil or another acoustic wave resonator.

6 Claims, 4 Drawing Sheets

VOLTAGE CONTROLLED OSCILLATOR INCLUDING A SAW RESONATOR

BACKGROUND OF THE INVENTION

1. Field of the Invention

The present invention relates to a voltage-controlled oscillator which may be used in mobile telephones and other apparatus.

2. Prior Art

Conventionally, in a voltage-controlled oscillator of this kind (hereinafter called VCO), a dielectric resonator and so forth using ceramic has been employed as an impedance element in a resonant circuit. Recently, however, together with the requirement of miniaturization of a mobile telephone set and so forth, a mobile telephone set which uses a surface acoustic wave resonator (hereinafter, called a SAW-R) as an impedance element in its resonant circuit is being developed.

FIG. 6 is a circuit diagram showing an example of the constitution of a VCO using a SAW-R. In FIG. 6, reference numeral 1 is a control voltage input terminal, 2 is a choke coil, 3 is a variable capacitance diode, 4 is a capacitor, 5 is a SAW-R, 6 is an expansion coil, 7 is a DC blocking capacitor, 8 is a transistor, 9 and 10 are feedback capacitors, 11 is an earthing capacitor, 12 is an output capacitor, and 13 is an output terminal. With such a constitution, when a voltage applied to the control voltage input terminal 1 is varied, the capacitance of the variable capacitance diode 3 varies, and a resonant frequency of a resonant circuit composed of the expansion coil 6, the SAW-R 5, the capacitor 4, and the variable capacitance diode 3 varies in response to the variation in the capacitance of the diode 3, by which an oscillation frequency of the VCO varies.

FIG. 7 shows an equivalent circuit of a SAW-R, and FIG. 8 shows a reactance characteristic (solid line Al) of the SAW-R. In FIG. 8, the abscissa shows a frequency, and the ordinate shows a reactance. FIG. 8 shows that the characteristic in the upper portion of the abscissa is inductive and that the lower portion of the abscissa is capacitive. The frequency fs is the frequency at which the SAW-R comes into a series resonant state, and the frequency fp is the frequency at which the SAW-R comes into a parallel resonant state. In the case where the series circuit of the variable capacitance diode 3 and a SAW-R 5 resonates, the width of change of capacitance of the variable capacitance diode 3 is represented by ΔC as shown in FIG. 8, the width of change of inductance of the SAW-R 5 is ΔL as shown in FIG. 8, and the width of change of an oscillation frequency of the VCO is ΔF as shown in FIG. 8.

In a mobile telephone and so forth, an oscillation frequency of a VCO ranges over 800 to 900 MHz, a frequency deviation 25 to 33 MHz is required as a width of change of a frequency, and a value not less than a fixed value is required as a C/N (carrier signal level/noise level) characteristic.

In order to make the width of change Δf, the expansion coil 6 shown in FIG. 6 (or a microstrip line) has been connected in series with the SAW-R 5. When the expansion coil 6 is inserted, a reactance characteristic of the SAW-R 5 plus the expansion coil 6 is like a broken line A2 as shown in FIG. 8, the series resonant frequency fs lowers, and the width of change Δf of an oscillation frequency of the VCO enlarges to Δf₁. However, there has been a problem that when a coil having a large inductance is used as the expansion coil 6, Q of the resonant circuit lowers and consequently, the ratio C/N lowers.

SUMMARY OF THE INVENTION

The present invention is devised in consideration of the above-mentioned affairs, and it is an object of the present invention to provide a voltage-controlled oscillator which does not reduce the ratio C/N remarkably, and moreover allows a sufficiently large width of change of an oscillation frequency to be obtained.

The first invention is characterized in that a voltage controlled oscillator comprises a resonant circuit formed of an impedance in series with a voltage variable capacitance, wherein the impedance consists of a surface acoustic wave resonator connected in parallel with an inductance coil.

In addition the second invention is characterized in that the impedance consists of at least two surface wave resonators connected in parallel.

According to the first invention, as shown in FIG. 2, the frequency fp at which a parallel circuit of a SAW-R and an inductor comes into a parallel resonant state is shifted toward the higher frequency side (see frequency fp) compared with the case where the parallel circuit is composed of only a SAW-R, by which the width of change Δf is enlarged. Also, according to the second invention, as shown by a solid line A4 in FIG. 4, the shape of a reactance characteristic changes, by which the width of change Δf is enlarged.

DETAILED DESCRIPTION OF THE PREFERRED EMBODIMENTS

Hereinafter, embodiments according to the present invention will be described.

Figure 1:
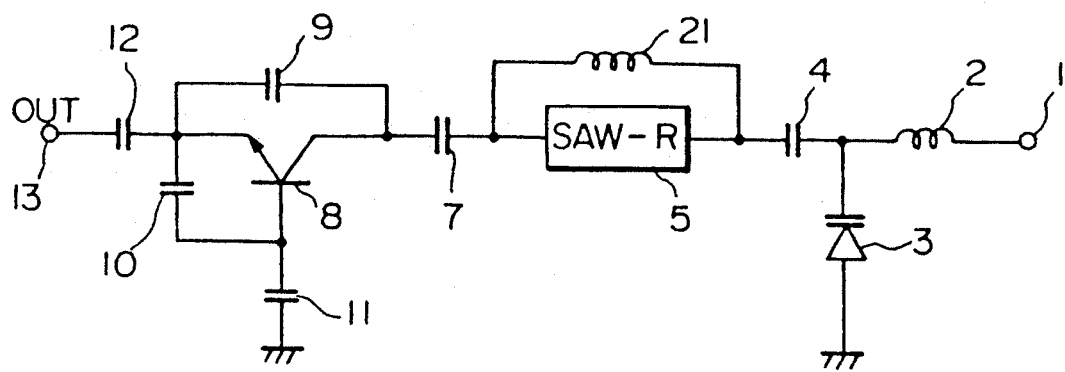
FIG. 1 is a circuit diagram showing a constitution of a first embodiment of the invention.
Figure 6:
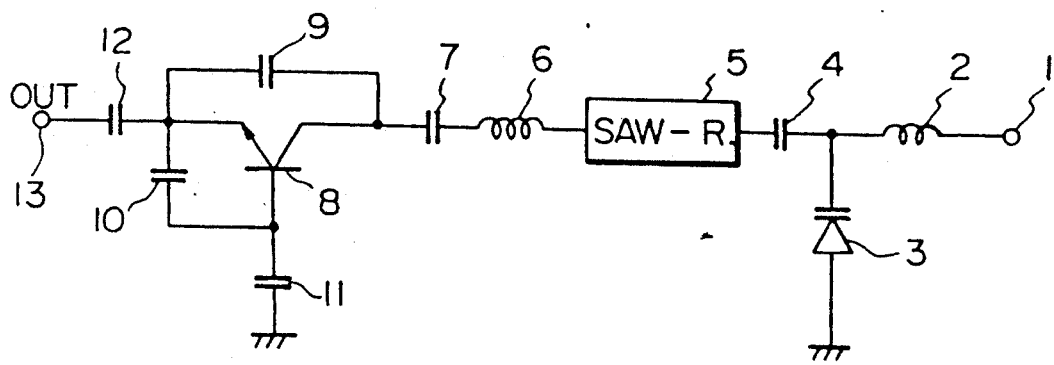
FIG. 6 is a circuit diagram showing a constitution of a conventional VCO.

FIG. 1 is a circuit diagram showing a constitution of a first embodiment according to the present invention, and parts corresponding to those in FIG. 6 are identified by the same numerals. The point at which the circuit shown in FIG. 1 is different from that in FIG. 6 is that the circuit shown in FIG. 1 is not provided with the expansion coil 6 in FIG. 6, and instead thereof a coil 21 is provided in parallel with the SAW-R 5.

Figure 2:
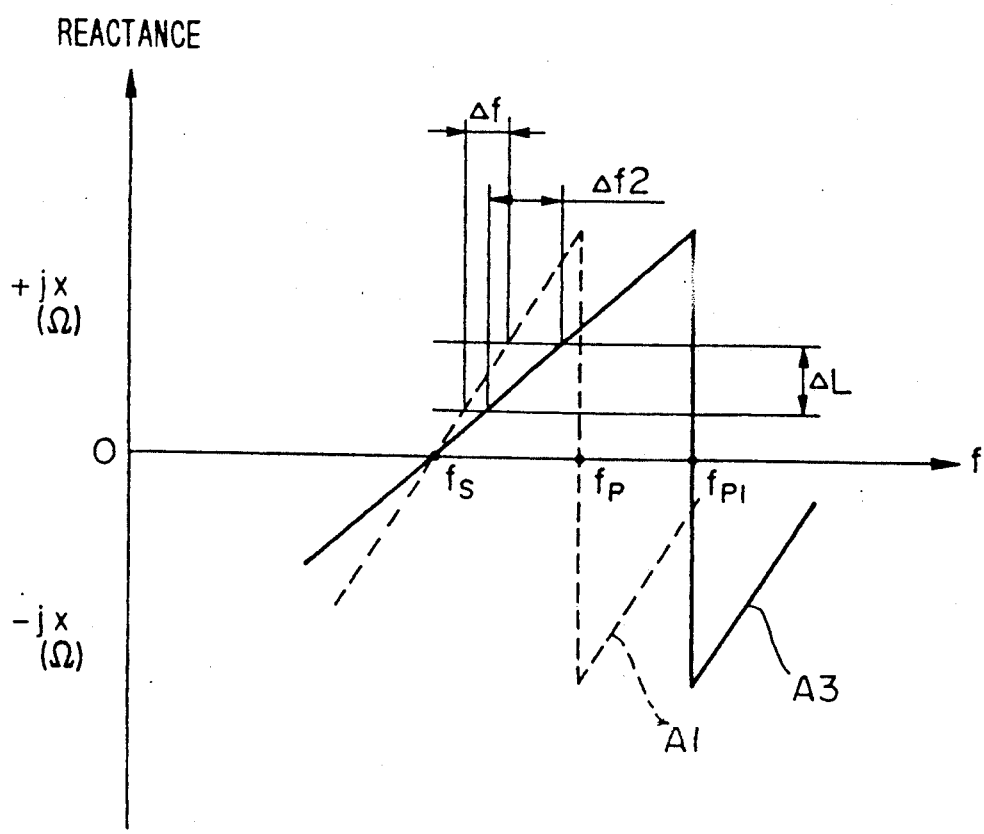
FIG. 2 is a diagram showing a reactance characteristic of a parallel circuit of a SAW-R 5 and a coil 21 in FIG. 1.

A broken line A1 in FIG. 2 is a reactance characteristic diagram of the above-mentioned SAW-R 5, and a solid line A3 is a reactance characteristic diagram of a parallel circuit of the SAW-R 5 and the coil 21. As shown in FIG. 2, upon insertion of the coil 21, the frequency fp is shifted toward the higher frequency side (see frequency fp), by which the width of the change Δf is enlarged to Δf₂. Also, according to this embodiment, since the oscillation frequency is shifted toward the higher frequency side by insertion of the coil 21, a high frequency can be made to oscillate without reducing the pitch of an electrode for forming the SAW-R. Consequently, there is a merit that the SAW-R is manufactured more easily compared with the circuit in FIG. 6 in which the oscillation frequency is shifted toward the lower frequency side.

In the above-mentioned embodiment, an expansion coil or a microstrip line having a comparatively small inductance may be inserted between a DC blocking capacitor 7 and a parallel circuit of a SAW-R5 and a coil 21, or between a capacitor 4 and a parallel circuit of a SAW-R5 and a coil 21 without departing from the scope of the invention. Also, a microstrip line may be used in place of the coil 21.

Figure 3:
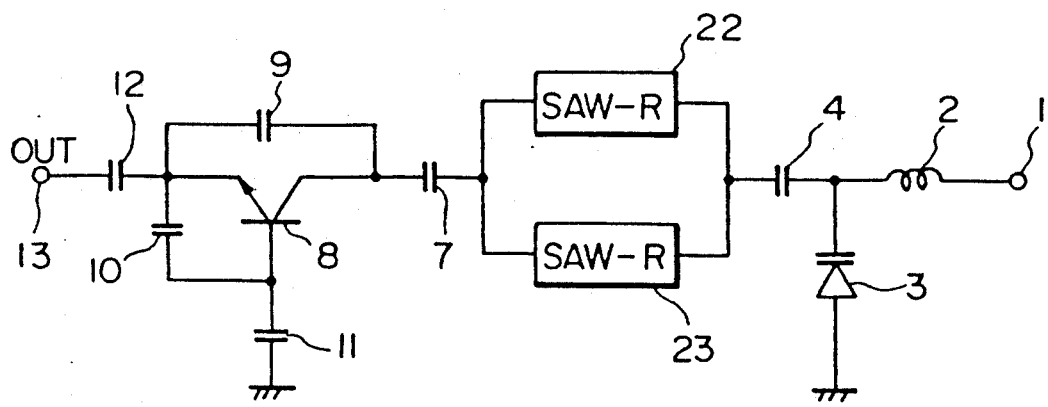
FIG. 3 is a circuit diagram showing a constitution of a second embodiment of the invention.
Figure 4:
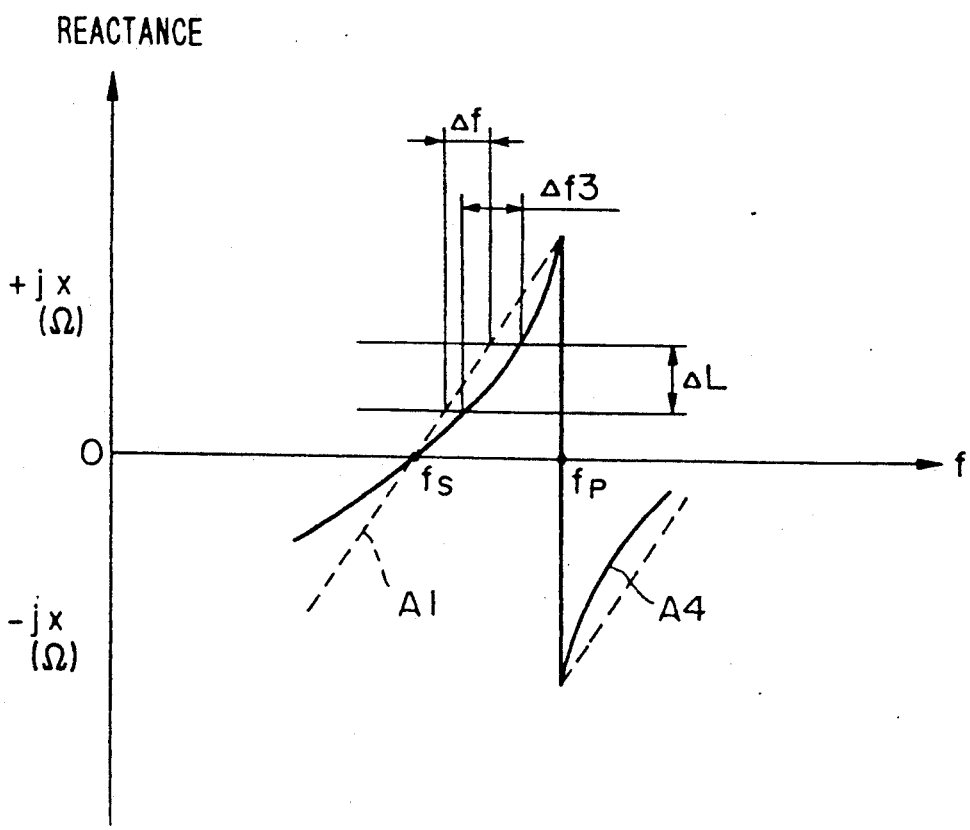
FIG. 4 is a diagram showing a reactance characteristic of a parallel circuit of SAW-Rs 22 and 23 in FIG. 3.
Figure 7:
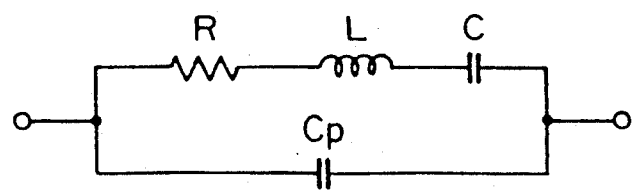
FIG. 7 is an equivalent circuit diagram of a SAW-R.
Figure 8:
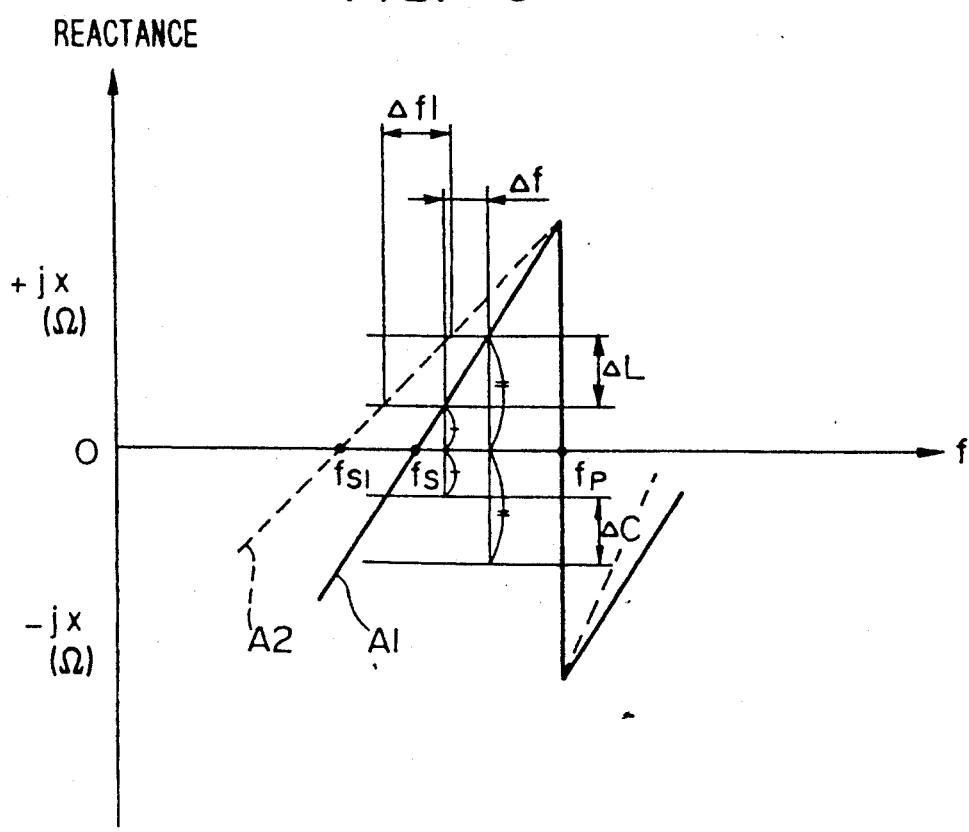
FIG. 8 is a diagram showing a reactance characteristic of a SAW-R and that of a series circuit of a SAW-R and an expansion coil.

FIG. 3 is a circuit diagram showing a constitution of a second embodiment according to the present invention. The point at which the circuit shown in FIG. 3 is different from that in FIG. 1 is that in the circuit shown in FIG. 3, a parallel circuit of two SAW-Rs having an equal characteristic, that is, a SAW-R 22 and a SAW-R 23 are used in place of the parallel circuit of the SAW-R 5 and the coil 21 in FIG. 4 shows a reactance characteristic of the parallel circuit of the SAW-Rs 22 and 23, and a broken line A1 shows a reactance characteristic of one SAW-R. As shown in FIG. 4, even if the two SAW-Rs are connected in parallel, its series resonant frequency fs and its parallel resonant frequency fp do not change from the case where one of the two SAW-Rs is used. However, as shown: the characteristic curves in FIG. 4, the width of change Δf is enlarged to Δf₃. The value of Q of one SAW-R is represented by the following expression (1) in the equivalent circuit in FIG. 7.

$$Q = wL/R \quad (1)$$

where w, L, and R respectively represent the angular frequency, coil inductance and resistance. In the case where the two SAW-Rs are connected in parallel, L becomes L/2, and R becomes R/2 in the expression (1). Accordingly, the value of Q does not change. In other words, according to the second embodiment, the width of change Δf can be enlarged without lowering the value of Q at all and consequently, without reducing the value of C/N.

Figure 5:
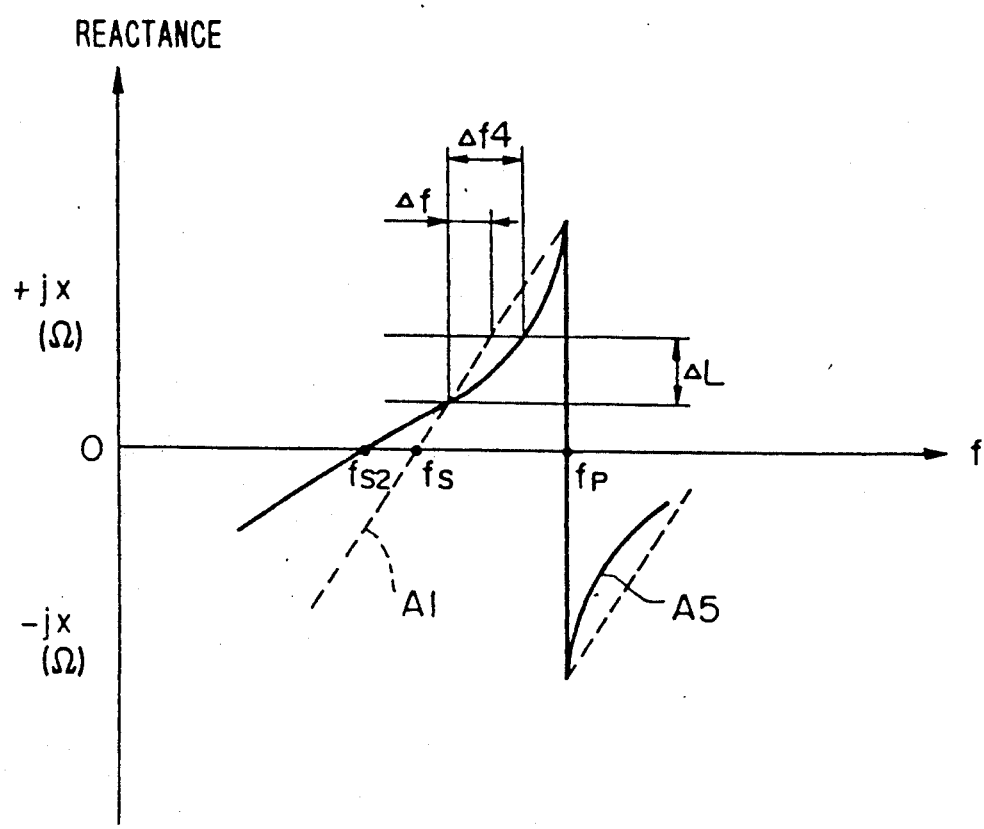
FIG. 5 is a diagram showing a reactance characteristic in the case where an expansion coil is inserted in series in the parallel circuit of the SAW-Rs 22 and 23.

An expansion coil (or a microstrip line) having a comparatively small inductance may be inserted between a DC blocking capacitor 7 and a parallel circuit of the SAW-R22 and 23, or between a capacitor 4 and a parallel circuit of the SAW-R22 and 23. In this case, as shown in FIG. 5, the series resonant frequency fs2 lowers to fs, and consequently, the width of change can be enlarged more than that in the case where the circuit in FIG. 3 is used (see Δf₄). A coil or a microstrip line may be further connected in parallel with the parallel circuit of the SAW-Rs 22 and 23. Also, though two SAW-Rs are connected in parallel in the above-mentioned embodiment, the number of the elements connected in parallel may be three or more.

As described above, according to the present invention, a sufficiently large width of change of an oscillation frequency can be obtained without lowering the value of Q of a resonant circuit and consequently, without lowering the value of C/N.

What is claimed is:

1. A voltage controlled oscillator comprising a resonant circuit formed of an impedance in series with a voltage variable capacitance, wherein said impedance consists of a surface acoustic wave resonator connected in parallel with an inductance coil.

2. The voltage controlled oscillator as recited in claim 1 wherein said surface acoustic wave resonator and said inductance coil are connected in parallel with respect to an input signal received by said impedance.

3. The voltage controlled oscillator as recited in claim 1 wherein said surface acoustic wave resonator is connected directly in parallel with said inductance coil.

4. A voltage controlled oscillator comprising a resonant circuit formed of an impedance in series with a voltage variable capacitance, wherein said impedance consists of at least two surface acoustic wave resonators connected in parallel.

5. A voltage controlled oscillator comprising:
 a control voltage input terminal for receiving a voltage signal to control an oscillation frequency of said voltage controlled oscillator;
 a choke coil coupled to said control voltage input terminal;
 a voltage variable capacitance coupled to said choke coil;
 a resonant circuit formed of an impedance in series with said voltage variable capacitance, wherein said impedance consists of a surface acoustic wave resonator connected in parallel with an inductance coil;
 a DC blocking capacitor coupled to said resonant circuit; and
 an oscillator output terminal coupled to said DC blocking capacitor for providing an oscillator output signal.

6. A voltage controlled oscillator comprising:
 a control voltage input terminal for receiving a voltage signal to control an oscillation frequency of said voltage controlled oscillator;
 a choke coil coupled to said control voltage input terminal;
 a voltage variable capacitance coupled to said choke coil;
 a resonant circuit formed of an impedance in series with said voltage variable capacitance, wherein said impedance consists of at least two surface acoustic wave resonators connected in parallel;
 a DC blocking capacitor coupled to said resonant circuit; and
 an oscillator output terminal coupled to said DC blocking capacitor for providing an oscillator output signal.

* * * * *